United States Patent
Honda et al.

(10) Patent No.: US 6,998,911 B2
(45) Date of Patent: Feb. 14, 2006

(54) GATE CONTROL CIRCUIT WITH SOFT START/STOP FUNCTION

(75) Inventors: Jun Honda, El Segundo, CA (US); Xiao-chang Cheng, San Jose, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/016,632

(22) Filed: Dec. 17, 2004

(65) Prior Publication Data

US 2005/0151585 A1  Jul. 14, 2005

Related U.S. Application Data

(60) Provisional application No. 60/530,449, filed on Dec. 18, 2003.

(51) Int. Cl.
*H03F 3/38* (2006.01)
(52) U.S. Cl. .................. 330/10; 330/207 A; 330/251; 381/94.5; 375/238; 327/126
(58) Field of Classification Search ............. 330/9, 330/10, 207 A, 251; 327/126; 381/94.5; 375/238
See application file for complete search history.

(56) References Cited

U.S. PATENT DOCUMENTS

| | | | | |
|---|---|---|---|---|
| 4,390,849 A | * | 6/1983 | Miskin | 330/251 |
| 6,384,678 B1 | * | 5/2002 | Berkhout | 330/10 |
| 6,388,514 B1 | * | 5/2002 | King et al. | 330/10 |
| 2005/0151585 A1 | * | 7/2005 | Honda et al. | 330/10 |

* cited by examiner

*Primary Examiner*—Michael B Shingleton
(74) *Attorney, Agent, or Firm*—Ostrolenk, Faber, Gerb, & Soffen, LLP

(57) ABSTRACT

A control terminal driver circuit for a switching amplifier including a driver for each of a pair of output power transistors responsive to a PWM information signal. The circuit operates in response to an operating state signal indicating a start up condition for the amplifier to vary the amplitude of the drive pulses for the output transistors between a zero value and a maximum value for normal operation of the amplifier over a start up interval, and to reverse the process during a shut down interval. A DC offset detector is provided to detect a DC offset at amplifier output, and an error circuit responsive to an output of the DC offset detector controls the relative amplitude of the driver outputs during at least a portion of the start up interval to substantially eliminate the DC offset. Also disclosed is a switching amplifier including a control terminal driver circuit as described above.

21 Claims, 3 Drawing Sheets

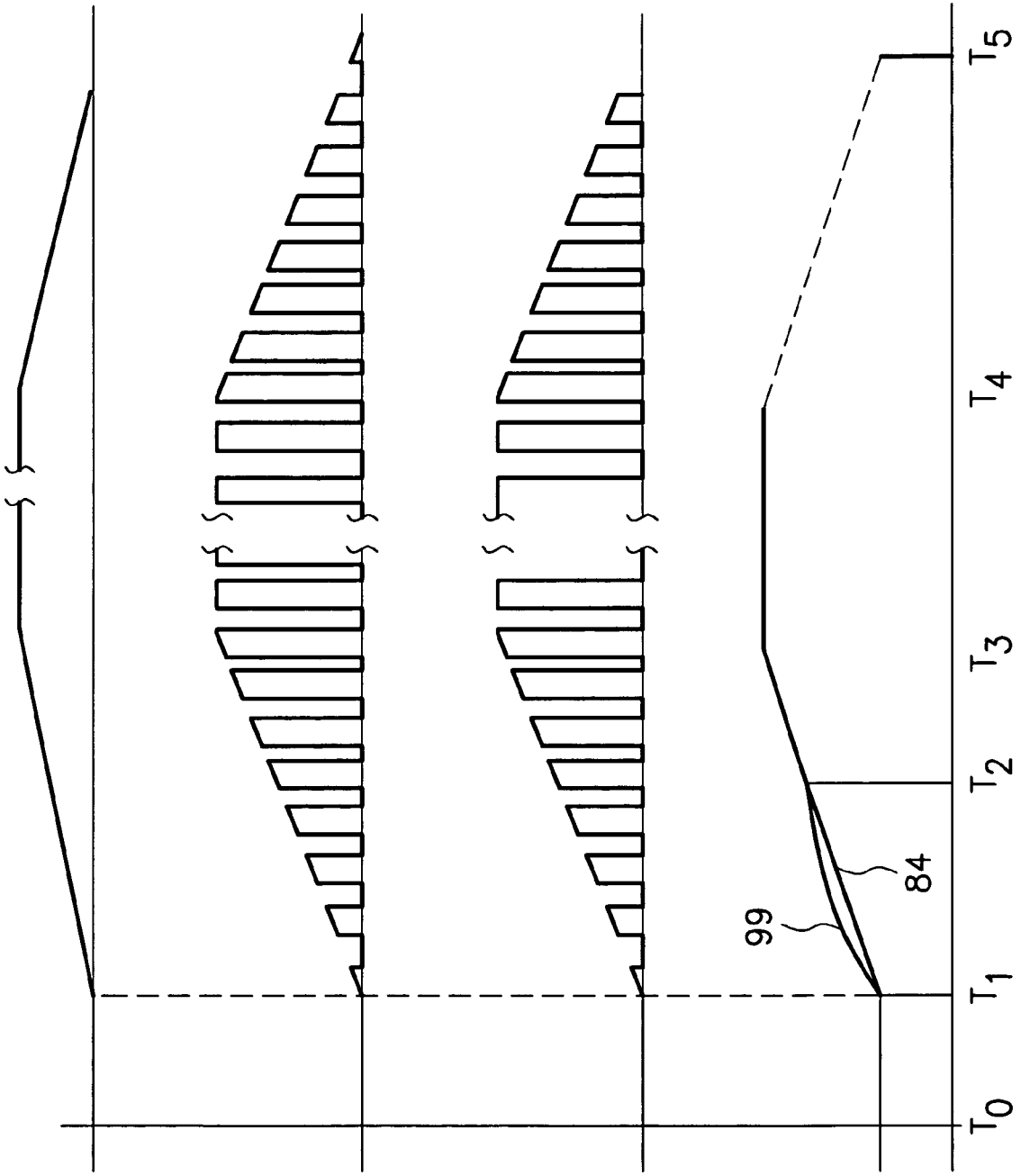

GATE CONTROL CIRCUIT WITH SOFT START/STOP FUNCTION

CROSS REFERENCE TO RELATED APPLICATIONS

This application claims the benefit and priority of U.S. Provisional patent application Ser. No. 60/530,449 filed Dec. 18, 2003 entitled GATE DRIVER WITH SOFT START FUNCTION, the entire disclosure of which is incorporated herein by reference.

BACKGROUND OF THE INVENTION

1. Field of the Invention

This invention relates to switching amplifiers and more specifically to such amplifiers in which an improved technique is employed to eliminate the noises which occur when the amplifier is powered up or powered down. The invention is described in the context of an audio frequency amplifier, but the invention also has utility in switching amplifiers operating at other frequencies, or in other applications for which high and low side series connected power transistors such as MOSFETS are used to drive a load from a common node between the transistors.

2. Relevant Art

Switching amplifiers, also commonly known as Class D amplifiers, are characterized by an output stage in the form of a pair of transistors, typically MOSFETS, connected in series between positive and negative sides of a power supply. In the case of audio amplifiers, the common node between the MOSFETS is connected to drive a loudspeaker through a low-pass filter. In operation, the two output transistors function as switches, i.e. they are alternately driven between a substantially fully conductive and a substantially fully non-conductive state. Therefore, except for losses due to $R_{ds}$ of the MOSFET, the voltage at the common output node is alternately switched between the positive and negative supply voltages.

Amplification of the audio signal is achieved by pulse width modulation (PWM) of the gate drive signals for the power transistors, and the amplified is recovered by the low pass filter. To facilitate this, the switching frequency is selected to be very high compared to the audio signal (e.g., 250–300 KHz).

Because the output transistors are either substantially fully on or substantially fully off except during the switching transitions, the class D amplifier exhibits low power consumption and high efficiency. With good circuit design, efficiency of 75% or even as high as 90% can readily be achieved. Moreover, modern Class D amplifiers exhibit excellent audio frequency response and distortion values which are comparable to those of well designed audio amplifiers of other types. Class D amplifiers have been known for almost 50 years, but are finding increasing utility in applications where high heat dissipation (due to high current usage) must be avoided, such as flat panel televisions, and where battery life must be maximized for economy and user convenience, such as in cell phones and other portable audio equipment.

FIG. 1 shows a conventional class D amplifier 10 having a half-bridge topology with two MOSFET output transistors 12 and 14 driving a loudspeaker 16 though an LC filter 18. The audio input signal is provided at 20, and along with a negative feedback signal from a feedback circuit 22, is coupled through an error amplifier 24 to one input of a comparator 26. The other input for comparator 26 is provided by a triangle wave generator 28 to provide a pulse width modulated input signal for a gate drive circuit 30 which controls the operation of MOSFETS 12 and 14.

FIG. 2 shows the output stage of a class D amplifier 40 in a full or H-bridge topology. Here, two MOSFET output transistor pairs 42a–42b and 44a–44b drive a loudspeaker 46 though respective LC filters 48a–48b. This provides added audio output power with the same power supply voltage, and also facilitates open loop operation, but obviously at the price of a more complex and costly circuit.

One of the issues in the design of a class D amplifier is how to deal with the switching noise which occurs during powering up and powering down of the output transistors. Conventionally, this is done by use of a relay between the output circuit and the loudspeaker, but this can add significantly to the size and cost of the amplifier.

An alternative approach which has been considered is to provide a soft start and soft stop by gradually varying the gate drive for the output transistors. For example, it has been proposed to provide a circuit which gradually increases the pulse width of the gate drive signals during a startup interval, and gradually decreases the pulse width during a shut down interval. This is however, not usable in the half bridge topology of FIG. 1 because the inherent DC offset which results from the changing duty cycle causes a clicking noise which is just as objectionable as the switching noise itself.

Another possible approach is to gradually increase the gate voltage for the output MOSFETS by increasing the height of the gate drive pulses, during the start up interval until full switching operation is achieved, and to shut down the amplifier by the reverse process. However, since the on voltage $V_{th}$ of a MOSFET varies from unit to unit, a voltage imbalance, i.e., DC offset, can still exist, and this must be dealt with in both the half and full bridge topology. A suitable method is therefore still needed to eliminate use of the relay in a class D amplifier to achieve a less expensive and more compact design.

SUMMARY OF THE INVENTION

The present invention meets this need by providing feedback compensation for any DC offset in both the half and full bridge topologies. In accordance with the invention, the amplitude of the gate drive pulses for the MOSFET output stages is ramped up and down during the start up and shut down intervals to provide a soft on and off characteristic for the amplifier. In a half bridge configuration, the DC compensation feedback loop is coupled between the common node of the MOSFETS or to the output of the audio filter and a ramp control circuit which controls the rate of increase or decrease of the amplitude of the gate drive pulses. In a full bridge configuration, the DC compensation feedback loop is coupled to both MOSFET driver pairs to provide a differential input. The feedback circuit averages the output signal or otherwise operates to generate an error signal representing a DC offset level. The error signal is used to adjust the slope of the gate drive ramp for the high side or low side MOSFET to balance out the DC offset during the start up and shut down intervals.

The soft start/stop function is implemented according to the invention as part of a gate drive integrated circuit (IC), which, together with the PWM circuit, the MOSFETS, and other ancillary circuits, are assembled into a complete class D amplifier.

It is accordingly an object of this invention to provide an improved gate drive circuit for a high and low side series connected power transistor pair for use in switching applications such as class D amplifiers, which eliminates the need for a relay to disconnect the amplifier from the loud speaker during start up and shut down.

It is a further object to provide such an improved gate drive circuit which can be used with both half and full bridge topologies.

It is a further object to provide such an improved gate drive circuit in which the amplitude of the gate drive pulses is ramped up during start up and ramped down during shut off, and in which a negative feedback circuit is provided to sense and compensate for any DC offset in the loud speaker drive circuits.

It is also an object of the invention to provide a class D audio amplifier which provides a soft start up and shut down, and thus does not require a relay to disconnect the amplifier from the loud speaker during start up and shut down intervals to eliminate audible noise during these intervals.

It is another object to provide such an amplifier in either a half bridge or full bridge configuration.

It is an additional object to provide such an amplifier in which the soft on and off functions are implemented by ramping up the amplitude of the gate drive pulses during the start up interval, and by ramping down the gate drive pulse amplitude during the shut down interval, and in which negative feedback is employed to sense and compensate for any DC offset in the loud speaker drive circuits.

BRIEF DESCRIPTION OF THE DRAWINGS

Other objects and features of the invention will become apparent from consideration of the following detailed description and the accompanying drawings, in which:

FIG. 5 is waveform diagram of the ramp up and ramp down for the high side and low side MOSFETS, and for the DC offset control.

DETAILED DESCRIPTION OF THE INVENTION

Figure 3:
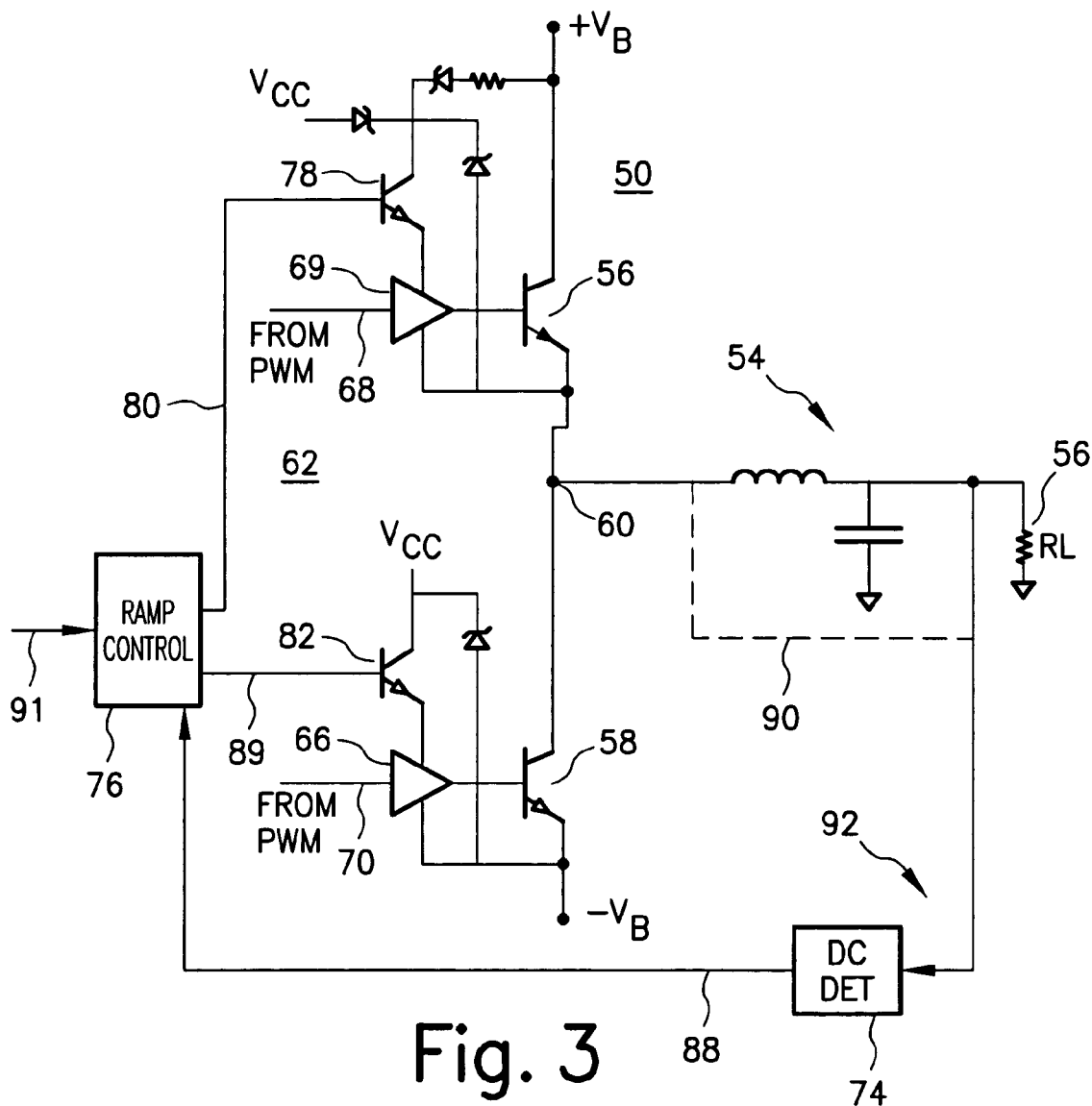
FIG. 3 shows a circuit diagram of a portion of a class D amplifier in which the soft start and stop feature of the present invention is implemented.

Referring to FIG. 3, there is shown at 50, a portion of a class D amplifier in half bridge topology driving loudspeaker 52 shown schematically as a load $R_L$ through an LC filter 54. High and low side output MOSFETS 56 and 58 are connected with their current paths in series between the positive and negative sides + and –VB of the output (load) power supply, with the common node 60 connected to filter 54. A gate control circuit 62, preferably in the form of a unitary chip, includes gate drivers 64 and 66 for MOSFETS 56 and 58 respectively, as well as ancillary gate drive (logic) power supply circuits 78 and 82 of any conventional or desired construction.

Figure 1:
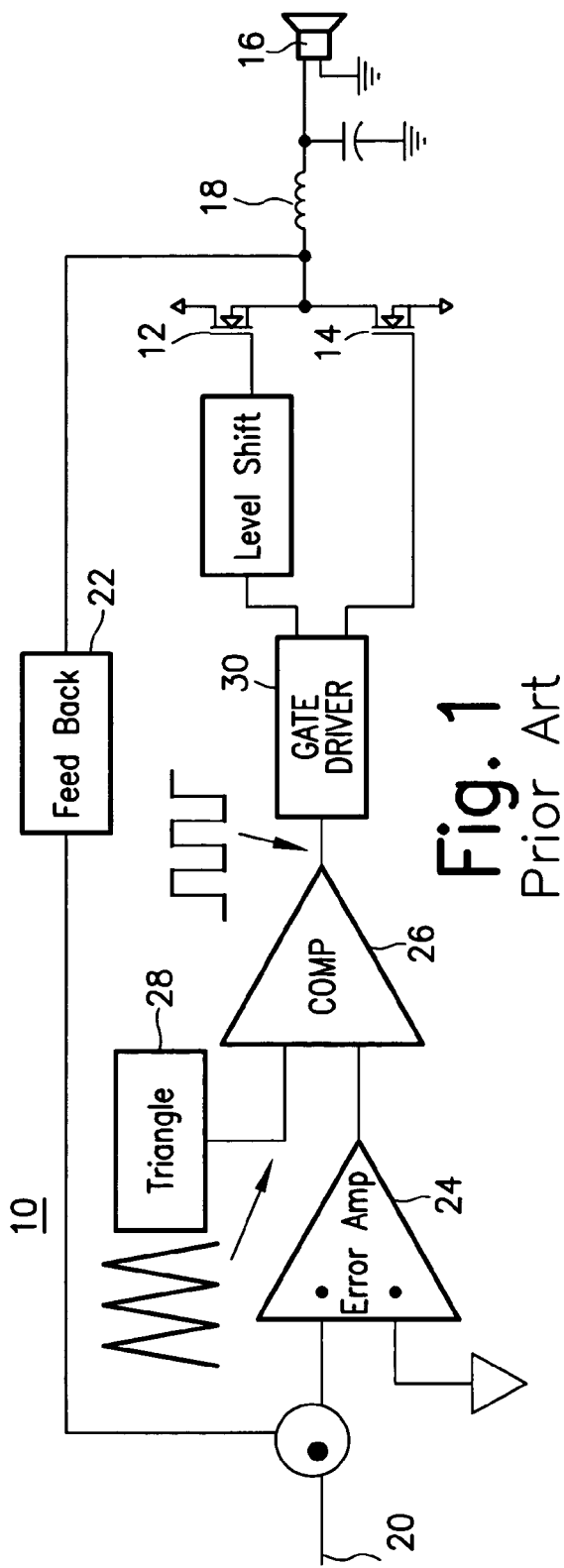
FIG. 1 shows a circuit diagram of a class D amplifier having a conventional half bridge topology.
Figure 2:
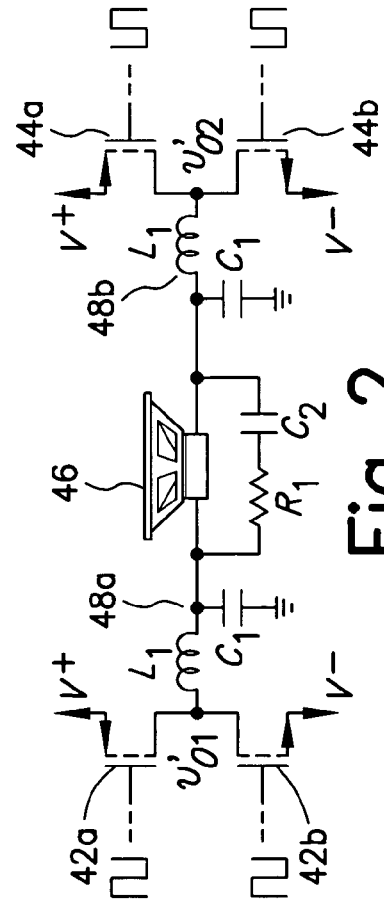
FIG. 2 shows a circuit diagram of the output stage of a class D amplifier having a conventional H-bridge or full bridge topology.

Gate control circuit 62 also includes a feedback loop 72 and a ramp control circuit 76. Feedback loop 72 is functionally and structurally separate from audio feedback loop 22 illustrated in FIG. 1, and includes a DC detector 74 of any suitable type, coupled as shown to the output of audio recovery filter 54. This provides a signal representative of any DC offset by way of lead 88 as one input to ramp control circuit 76. It will be appreciated, however, that the input of DC detector 74 can alternatively be coupled on the input side of filter 54 as indicated by dotted line 90.

Gate drivers 64 and 66 each receive the audio-modulated PWM signal from a suitable PWM circuit (not shown) at respective inputs 68 and 70. The class D amplifier operation in respect to the PWM audio signal is conventional, and further description is omitted in the interest of brevity.

Figure 4:
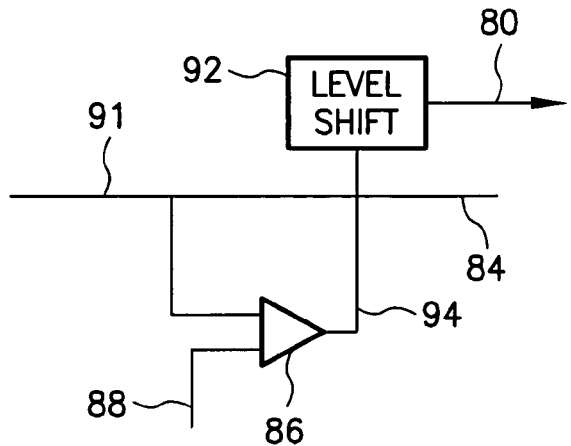
FIG. 4 shows a block diagram of the ramp control circuit shown in FIG. 3.

With reference to FIGS. 3 and 4, ramp control circuit 76 includes an error amplifier 86 which receives the DC error signal input on lead 88 from DC detector 74 and an output MOSFET power on-power off control signal on lead 91 from a master controller such as a microprocessor (not shown). The output of error amplifier 86 is connected by a lead 94 to a level shifter 92 which, in turn, provides the gate control signal on lead 80 for logic power supply MOSFET 78 associated with high-side gate drive circuit 64. The power on-power off control signal on lead 91 is also provided directly as the gate control signal on lead 84 for logic power supply MOSFET 82 associated with low-side gate drive circuit 66.

Referring now additionally to FIG. 5, waveform on line (a) shows the power on-power off control signal beginning at a time T1 and continuing until a time T5, at which it is assumed that the amplifier is to be shut down. As illustrated, this signal is in the form of a rising ramp from time T1 to time T3 (i.e., the start up interval), then remains at a fixed level during a normal operating interval from T3 to a time T4). Also, if desired, a conventional muting interval from system start up at a time T0 to time T1 may also be provided during which power to output MOSFETS 56 and 58 is shut down completely to allow stabilization of other circuit elements, as an additional measure to eliminate audible startup noise.

When the system is to be shut off, the power on-power off control signal on lead 91 takes the form of a falling ramp as shown over the interval T4 to T5.

The waveforms in lines (b) and (c) in FIG. 5 illustrate the gate drive signals for MOSFETS 56 and 58, respectively. The PWM signals on leads 68 and 70 are effectively amplitude modulated by the ramping up of the conduction of logic power supply MOSFETS 64 and 66 during the start up interval T1–T3, and by the ramping down of the conduction of logic power supply MOSFETS 64 and 66 during the shut down interval from T4–T5.

To avoid the DC offset problem described above, a DC error compensation signal on lead 88 is combined with the power on-power off ramp signal in error amplifier 86 to provide a different instantaneous conductivity level for transistors 78 and 82. This increases the power supply voltage to one of gate drivers 64 or 66, and consequently imposes an asymmetry in the outputs of MOSFETS at node 60. The different voltages on lead 84 and at the output of error amplifier 86 on lead 94 are shown in line (d) of FIG. 5. Here, it is assumed that the conductivity of MOSFET 56 must increase slightly faster than that of MOSFET 58. As the DC offset diminishes, and is ultimately eliminated, e.g., at time T2, the output of DC detector 74 goes to zero, and the values of the power on-power off ramp signal on lead 84 and the output of error amplifier 86 on lead 94 become equal.

During the shutdown phase, the DC offset compensation again functions as described above to impose any necessary asymmetry in the gate driver voltages to balance a DC offset.

Although the present invention has been described in relation to a particular embodiment thereof, many other variations and modifications and other uses will become apparent to those skilled in the art. It is intended, therefore, that the present invention is not be limited by the specific disclosure herein, but is to be given the full scope permitted by the appended claims.

What is claimed is:

1. A switching amplifier comprising:
two output transistors having respective current paths and control terminals,
the current paths being connected in series between positive and negative power supply terminals with a common output node between the transistors being connectable to drive a load;
a driver circuit for the control terminals;
signal source providing a pulse width modulated (PWM) signal, the duty cycle of which is representative of an information signal;
a control terminal driver circuit for each of the output transistors;
the control terminal driver circuits being responsive to the PWM signal to generate pulse width modulated control terminal drive pulses to drive the output transistors between substantially fully on and fully off states with one transistor being on while the other is off;
the control terminal driver circuits being further responsive to an operating state signal indicating a start up interval for the amplifier to vary the amplitude of the control terminal drive pulses between a zero value to a maximum value for normal operation of the amplifier over the start up interval;
a feedback circuit including a detector which is responsive to a DC offset at the output node;
and an error circuit responsive to an output of the detector to control the relative amplitude of the control terminal drive pulses during at least a portion of the start up interval to substantially eliminate DC offset.

2. A switching amplifier according to claim 1, further including a low pass filter connected to the output node, and adapted for connection to the load.

3. A switching amplifier according to claim 2, where the detector is connected to the output node.

4. A switching amplifier according to claim 2, where the detector is connected to an output of the low pass filter.

5. A switching amplifier according to claim 1, where the load is a loudspeaker.

6. A switching amplifier according to claim 1, where the control terminal driver circuits include respective power supply circuits which are responsive to the amplitudes of the operating state signal to vary the amplitude of the respective control terminal driver pulses.

7. A switching amplifier according to claim 6, where the operating state signal is in the form of a rising ramp during the start up interval, and in the form of a falling ramp during a shut down interval, and has a steady state value during normal amplifier operation.

8. A switching amplifier according to claim 7, wherein the power supply circuits are responsive to the falling ramp to reduce the amplitude of the control terminal drive pulses from the maximum value to zero during the shut down interval.

9. A switching amplifier according to claim 8, wherein the error circuit is further responsive to an output of the detector to control the relative amplitude of the control terminal drive pulses during at least a portion of the shut down interval. to substantially eliminate the DC offset.

10. A switching amplifier according to claim 6, wherein:
the error circuit includes an error amplifier having a first input connected to an output of the detector and a second input connected to the operating state signal,
the operating state signal is connected for one of the output transistors directly to the power supply circuit, and
outputs of the error amplifier is connected to the power supply circuit for the other power transistor.

11. A switching amplifier according to claim 10, further including a level shifter connecting the error circuit to one of the power supply circuits.

12. A switching amplifier according to claim 1, wherein:
the operating state signal includes a portion indicating a shut down interval for the amplifier; and
the driver circuits are operative during the shut down interval to reduce the amplitude of the control terminal drive pulses from the maximum value to zero.

13. A switching amplifier according to claim 12, wherein the error circuit is responsive to the output of the detector to control the relative amplitude of the control terminal drive pulses during at least a portion of the shut down interval to substantially eliminate DC offset.

14. A gate control circuit for a switching amplifier comprising two MOSFET output transistors having respective source to drain current paths and gate terminals, the current paths being connected in series between positive and negative power supply terminals and adapted to drive a load coupled to the common output node between the transistors,
wherein the gate control circuit is constructed and configured to operate the amplifier with one of the MOSFETS alternatingly in substantially fully on and fully off conduction states, and the other MOSFET substantially in the opposite conduction state in response to a PWM signal, the duty cycle of which represents an information signal; the gate control circuit comprising:
a gate driver for each MOSFET responsive to the PWM signal to generate pulse width modulated gate drive pulses for the MOSFETS;
a ramp control circuit connected to operate the gate drivers
the ramp control circuit being responsive to an operating state signal indicating a start up condition for the amplifier to vary the amplitude of the PWM pulse train between a zero value and a maximum value for normal operation of the amplifier over a start up interval; and
a DC offset detector adapted to be coupled to detect a DC offset at the common output node; and
an error circuit responsive to an output of the DC offset detector to control the relative amplitude of the gate drive pulses during at least a portion of the start up interval to substantially eliminate DC offset.

15. A gate control circuit according to claim 14, where the control terminal driver circuits include respective power supply circuits which are responsive to the amplitude of the operating state signal to vary the amplitudes of the respective control terminal driver pulses.

16. A gate control circuit according to claim 14, where the operating state signal is in the form of a rising ramp during the start up interval, and in the form of a falling ramp during a shut down interval, and has a steady state value during normal amplifier operation.

17. A gate control circuit according to claim 16, where the gate driver circuits are responsive to the falling ramp to reduce the amplitude of the control terminal drive pulses from the maximum value to zero during the shut down interval.

18. A gate control circuit according to claim 15, wherein:
the error circuit includes an error amplifier having a first input connected to an output of the detector and a second input adapted to receive the operating state signal,
the operating state signal is connected directly to the power supply circuit for the driver for one of the MOSFETS; and
an output of the error amplifier is connected to the power supply circuit for the driver for the other MOSFET.

19. A gate control circuit according to claim 15, further including a level shifter connecting the error circuit to one of the power supply circuits.

20. A switching amplifier according to claim 14, wherein:
the operating state signal includes a portion indicating a shut down interval for the amplifier; and
the gate driver circuits are operative during the shut down interval to reduce the amplitude of the control terminal drive pulses from the maximum value to zero.

21. A switching amplifier according to claim 20, wherein the error circuit is further responsive to an output of the detector to control the relative amplitude of the control terminal drive pulses during at least a portion of the shut down interval.

* * * * *